United States Patent
Park et al.

(10) Patent No.: US 11,335,676 B2
(45) Date of Patent: May 17, 2022

(54) SEMICONDUCTOR DEVICE

(71) Applicant: SK hynix Inc., Gyeonggi-do (KR)

(72) Inventors: Won-Kyung Park, Gyeonggi-do (KR); Seung-Hwan Yoon, Gyeonggi-do (KR)

(73) Assignee: SK hynix Inc., Gyeonggi-do (KR)

( * ) Notice: Subject to any disclaimer, the term of this patent is extended or adjusted under 35 U.S.C. 154(b) by 98 days.

(21) Appl. No.: 16/692,992

(22) Filed: Nov. 22, 2019

(65) Prior Publication Data
US 2020/0203335 A1 Jun. 25, 2020

(30) Foreign Application Priority Data
Dec. 24, 2018 (KR) .................. 10-2018-0168376

(51) Int. Cl.
*H01L 27/02* (2006.01)
*G01R 31/26* (2020.01)

(52) U.S. Cl.
CPC ...... *H01L 27/0292* (2013.01); *G01R 31/2621* (2013.01)

(58) Field of Classification Search
CPC ............. H01L 27/0292; H01L 27/0266; H01L 27/0296; H01L 22/30; G01R 31/2621; G01R 31/2856; G01R 31/2884
See application file for complete search history.

(56) References Cited

U.S. PATENT DOCUMENTS

| 6,683,351 | B2 | 1/2004 | Morita et al. | |
|---|---|---|---|---|
| 7,851,864 | B2 | 12/2010 | Chung et al. | |
| 10,510,742 | B1* | 12/2019 | Chu | H01L 23/535 |
| 2010/0213987 | A1* | 8/2010 | Takahashi | H01L 27/105 |
| | | | | 327/109 |
| 2014/0004700 | A1* | 1/2014 | Nakata | H01L 23/5221 |
| | | | | 438/688 |
| 2016/0019965 | A1* | 1/2016 | Watanabe | G11C 16/08 |
| | | | | 365/185.23 |
| 2016/0276229 | A1* | 9/2016 | Lin | H01L 22/14 |
| 2016/0329258 | A1* | 11/2016 | Lin | H01L 27/0266 |
| 2017/0162558 | A1* | 6/2017 | Chu | H01L 27/0292 |
| 2018/0211949 | A1* | 7/2018 | Uzawa | H01L 27/0288 |
| 2019/0237459 | A1* | 8/2019 | Hiura | H01L 21/3205 |

FOREIGN PATENT DOCUMENTS

WO WO-2018070260 A1 * 4/2018 ......... H01L 27/0255

* cited by examiner

Primary Examiner — Jarrett J Stark
(74) Attorney, Agent, or Firm — IP & T Group LLP

(57) ABSTRACT

A semiconductor device includes: a test transistor which is formed over a substrate; a test pattern structure which is formed in an upper portion of the substrate to be spaced apart from the test transistor; and a protection transistor which is positioned between the test pattern structure and the test transistor.

14 Claims, 9 Drawing Sheets

SEMICONDUCTOR DEVICE

CROSS-REFERENCE TO RELATED APPLICATIONS

The present application claims priority of Korean Patent Application No. 10-2018-0168376, filed on Dec. 24, 2018, which is incorporated herein by reference in its entirety.

BACKGROUND

1. Field

Various embodiments of the present invention relate generally to a semiconductor device and, more particularly, to a semiconductor device including a test pattern structure. The present invention also relates to a method for manufacturing the semiconductor device.

2. Description of the Related Art

While a semiconductor device is fabricated, a process of forming a thin film and/or a process of etching the thin film may be performed several times. Various treatments using plasma may be used for the process of forming a thin film and the process of etching the thin film.

In the plasma treatments, a line layer electrically connected to a gate electrode may collect charges from the plasma. As a result, a plasma-induced damage (PID) may occur in the gate dielectric layer.

Also, typically, when a semiconductor device is developed, the characteristics of a transistor may be checked by using a test pattern. However, it is still difficult to avoid the plasma-induced damage (PID) that may occur when the test pattern is formed.

Therefore, it is required to develop improved technology capable of preventing plasma induced damage during the testing of a transistor.

SUMMARY

Various embodiments of the present invention are directed to a semiconductor device capable of preventing a plasma-induced damage.

In accordance with an embodiment of the present invention, a semiconductor device includes: a test element; a test pattern structure; and a protection element which is operatively positioned between the test pattern structure and the test element for protecting the test element from a plasma induced damage.

In accordance with an embodiment of the present invention, a method for fabricating a semiconductor device includes forming a test transistor over a first region of a substrate; forming a protection transistor coupled to the test transistor and the protection transistor is formed over a second region of the substrate; and forming a test pattern structure coupled to the protection transistor and the test pattern structure is formed over the protection transistor, wherein a plasma-induced damage caused from the test pattern structure is discharged to the substrate through the protection transistor.

These and other features and advantages of the present invention will become better understood from the following detailed description of preferred embodiments in conjunction with the accompanying drawings.

DETAILED DESCRIPTION

Figure 1:
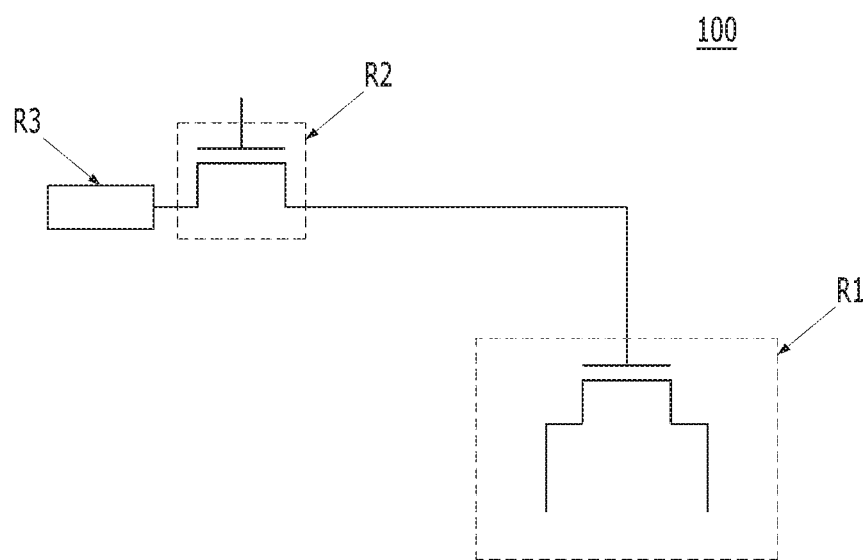
FIG. 1 is an equivalent circuit diagram of a semiconductor device in accordance with an embodiment of the present invention.

Various embodiments of the present invention will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Throughout the disclosure, like reference numerals refer to like parts throughout the various figures and embodiments of the present invention.

As used herein, singular forms are intended to include the plural forms as well, unless the context clearly indicates otherwise. The articles 'a' and 'an' as used in this application and the appended claims should generally be construed to mean 'one or more' unless specified otherwise or clear from context to be directed to a singular form.

It should be understood that the drawings are simplified schematic illustrations of the described devices and may not include well known details for avoiding obscuring the features of the invention.

It should also be noted that features present in one embodiment may be used with one or more features of another embodiment without departing from the scope of the invention. In the following embodiments of the present invention, a plasma-induced damage occurring on a pattern to be tested (i.e., a test transistor) may be minimized by not directly coupling a metal line of a test pattern to a gate electrode of the pattern to be tested (i.e., a test transistor) but interposing a protection transistor. Since the plasma ions generated in the subsequent process are not directly coupled to the test transistor, the test transistor may not be affected by the plasma-induced damage of the subsequent process.

Figure 2:
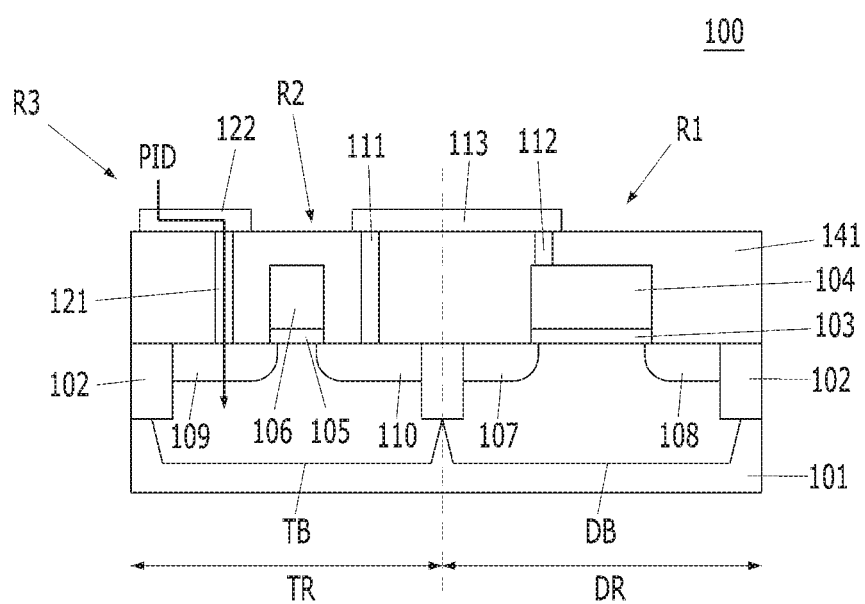
FIG. 2 is a cross-sectional view illustrating an embodiment of the semiconductor device of FIG. 1.

FIG. 1 is an equivalent circuit diagram of a semiconductor device in accordance with an embodiment of the present invention. FIG. 2 is a cross-sectional view illustrating an embodiment of the semiconductor device of FIG. 1.

Referring to FIGS. 1 and 2, the semiconductor device 100 may include a test element R1, a protection element R2, and a test pattern structure R3. The protection element R2 may be positioned in a stage before the test element R1. For example, the protection element R2 may be positioned between the test pattern structure R3 and the test element R1. The test element R1 may be a transistor, and for example a MOSFET. The protection element R2 may include a switching element. The protection element R2 may be a transistor, and for example a MOSFET.

The semiconductor device 100 may include a substrate 101. The substrate 101 may be formed of any material suitable for semiconductor processing. The substrate 101 may include a semiconductor substrate. The substrate 101 may be formed of a material containing silicon. The substrate 101 may include silicon, monocrystalline silicon, polysilicon, amorphous silicon, silicon germanium, monocrystalline silicon germanium, polycrystalline silicon germanium, carbon-doped silicon, a combination thereof or a multilayer thereof. The substrate 101 may include other semiconductor materials such as germanium. The substrate 101 may include a III/V-group semiconductor substrate, for example, a compound semiconductor substrate, such as GaAs. The substrate 101 may include an SOI (Silicon-On-Insulator) substrate.

The test transistor R1 and the protection element R2 may be isolated from each other by an isolation layer 102. The isolation layer 102 may be formed by a Shallow Trench Isolation (STI) process. The isolation layer 102 may include silicon oxide, silicon nitride, or a combination thereof. According to another embodiment of the present invention, the isolation layer 102 between the test transistor R1 and the protection element R2 may be omitted.

The test transistor R1 may be formed in a device region DR, and the protection element R2 and the test pattern structure R3 may be formed in a test region TR. The device region DR and the test region TR may be isolated by the isolation layer 102. A test transistor body DB and a protection element body TB may be formed in the substrate 101. The test transistor R1 may be formed in the test transistor body DB. The protection element R2 may be formed in the protection element body TB. Each of the test transistor body DB and the protection element body TB may include a conductive well. The test transistor body DB and the protection element body TB may include an N-type well or a P-type well. The protection element body TB may be referred to as a protection transistor body.

The test transistor R1 may include a first gate dielectric layer 103 and a first gate electrode 104. The first gate dielectric layer 103 may include silicon oxide, silicon nitride, silicon oxynitride or a high dielectric material. The first gate electrode 104 may include a silicon-containing material or a metal-containing material. The first gate electrode 104 may include polysilicon, tungsten, tungsten silicide, titanium nitride, tantalum nitride, or a combination thereof. The first gate electrode 104 may include an impurity-doped polysilicon, i.e., doped polysilicon. The impurity may include an N-type impurity or a P-type impurity. The impurity may include boron, arsenic, or a combination thereof. The test transistor R1 may further include a first source/drain region 107 and a second source/drain region 108. The first source/drain region 107 and the second source/drain region 108 may be doped with the same impurity. The first and second source/drain regions 107 and 108 may include an N-type impurity or a P-type impurity. The first and second source/drain regions 107 and 108 may be regions doped with a high-concentration impurity.

The protection element R2 may include a transistor, and for example a MOSFET. The protection element R2 may include a second gate dielectric layer 105 and a second gate electrode 106. The second gate dielectric layer 105 may include silicon oxide, silicon nitride, silicon oxynitride, or a high dielectric material. The second gate electrode 106 may include polysilicon, tungsten, tungsten silicide, titanium nitride, tantalum nitride, or a combination thereof. The second gate electrode 106 may include doped polysilicon. The impurity may include an N-type impurity or a P-type impurity. The impurities may include boron, arsenic, or a combination thereof. The protection element R2 may further include a first impurity region 109 and a second impurity region 110. The first impurity region 109 and the second impurity region 110 may be doped with the same impurity. The first and second impurity regions 109 and 110 may include an N-type impurity or a P-type impurity. The first and second impurity regions 109 and 110 may be referred to as a source region and a drain region. The first and second impurity regions 109 and 110 may be regions doped with a high-concentration impurity. According to an embodiment of the present invention, the protection element R2 may include an NMOSFET. Therefore, the first impurity region 109 and the second impurity region 110 may be referred to as an N-type source region and an N-type drain region, respectively. The protection element body TB may be a P-type well.

The first gate dielectric layer 103 and the second gate dielectric layer 105 may be formed of the same material. The first gate dielectric layer 103 and the second gate dielectric layer 105 may be formed of different materials. The first gate electrode 104 and the second gate electrode 106 may be formed of the same material. The first gate electrode 104 and the second gate electrode 106 may be formed of different materials. The length of the second gate electrode 106 may be shorter than the length of the first gate electrode 104, however, the invention may not be limited in this way. In some embodiments of the present invention (not shown), the isolation layer 102 may partially overlap with both ends of the first gate dielectric layer 103 to prevent punch in the operation of the transistor.

The test transistor R1 and the protection element R2 may be electrically connected to each other through conductive contacts 111 and 112 and a conductive line 113. The second impurity region 110 of the protection element R2 and the first gate electrode 104 of the test transistor R1 may be coupled to each other. The second impurity region 110 and the first gate electrode 104 of the protection element R2 may be coupled to the conductive contacts 111 and 112, and the conductive contacts 111 and 112 may be coupled to one conductive line 113. The conductive contacts 111 and 112 may be formed of any suitable conductive materials, including, for example, polysilicon, metal, metal nitride, metal silicide, or a combination thereof. In an embodiment the conductive contacts 111 and 112 may include a silicon-containing conductive material. In another embodiment, the conductive contacts 111 and 112 may include a metal or a metal-containing conductive material. The conductive line 113 may include any suitable conductive material, including, for example, polysilicon, metal, metal nitride, metal silicide, or a combination thereof. In an embodiment, the conductive line 113 may include a metal, or a metal containing conductive material.

The test pattern structure R3 may include a contact 121 and a metal line 122. A test voltage may be applied to the metal line 122. The first impurity region 109 of the protection element R2 may be coupled to the metal line 122 through the contact 121. The contact 121 may be referred to as a via contact.

The contact 121 may be formed of any suitable conductive material including, for example, polysilicon, metal, metal nitride, metal silicide, or a combination thereof. In an embodiment, the contact 121 may include a silicon-containing material. In another embodiment, the contact 121 may include a metal or a metal-containing material. The metal line 122 may be formed of any suitable metal, including, for example, tungsten, copper, or aluminum.

The contact 121 and the metal line 122 may be formed through any suitable process. For example, the contact 121 and the metal line 122 may be formed through a deposition process and an etching process, respectively. For example, after an inter-layer dielectric layer 141 is formed, a contact hole (not given with a reference numeral) penetrating through the inter-layer dielectric layer 141 may be formed, and the contact 121 may be formed in the contact hole. Also, as an example, after a metal layer is deposited over the contact 121, the metal line 122 may be formed by etching the metal layer. The metal line 122 may be formed by a dry etching process of the metal layer, that is, a plasma etching process.

According to another embodiment of the present invention, the contact 121 and the metal line 122 may be formed by a damascene process. The damascene process may include a single damascene process, a dual damascene process, a via first process, a trench first process, and the like. These processes are well-known in the art hence, detailed description thereof is hereby omitted in order to avoid obscuring the invention with unnecessary minutia.

As illustrated in the embodiment of FIG. 2, the conductive line 113 and the metal line 122 may be positioned at the same level. The conductive line 113 and the metal line 122 may be formed by the same process. The conductive line 113 and the metal line 122 may be formed of the same material. The contact 121 and the conductive contacts 111 and 112 may be formed by the same process. The contact 121 and the conductive contacts 111 and 112 may be formed of the same material.

As described above, the characteristics of the test transistor R1 may be monitored through the test pattern structure R3. Moreover, as the protection element R2 is formed between the test transistor R1 and the test pattern structure R3, it is possible to prevent the test transistor R1 from being damaged by a plasma-induced damage PID which may occur during a process of forming the test pattern structure R3.

More specifically, since the metal line 122 is not directly coupled to the test transistor R1, the plasma-induced damage PID may not affect the test transistor R1 while the metal line 122 is formed.

Plasma ions may be introduced into the metal line 122 when the metal line 122 is formed by a plasma etching process. According to the illustrated embodiment of the present invention of FIG. 2, the metal line 122 may be coupled to the first impurity region 109 of the protection element R2. For this reason, the plasma ions may be discharged into the substrate 101 through the first impurity region 109 of the protection element R2. As a result, a high potential is not applied to the first gate dielectric layer 103 of the test transistor R1, and therefore the first gate dielectric layer 103 is not is not damaged.

When the inter-layer dielectric layer or another line layer is formed using plasma after the metal line 122 is formed, even though plasma charges are collected into the metal line 122, the plasma charges may be discharged into the substrate 101 by passing through the first impurity region 109 of the protection element R2.

Figure 3:
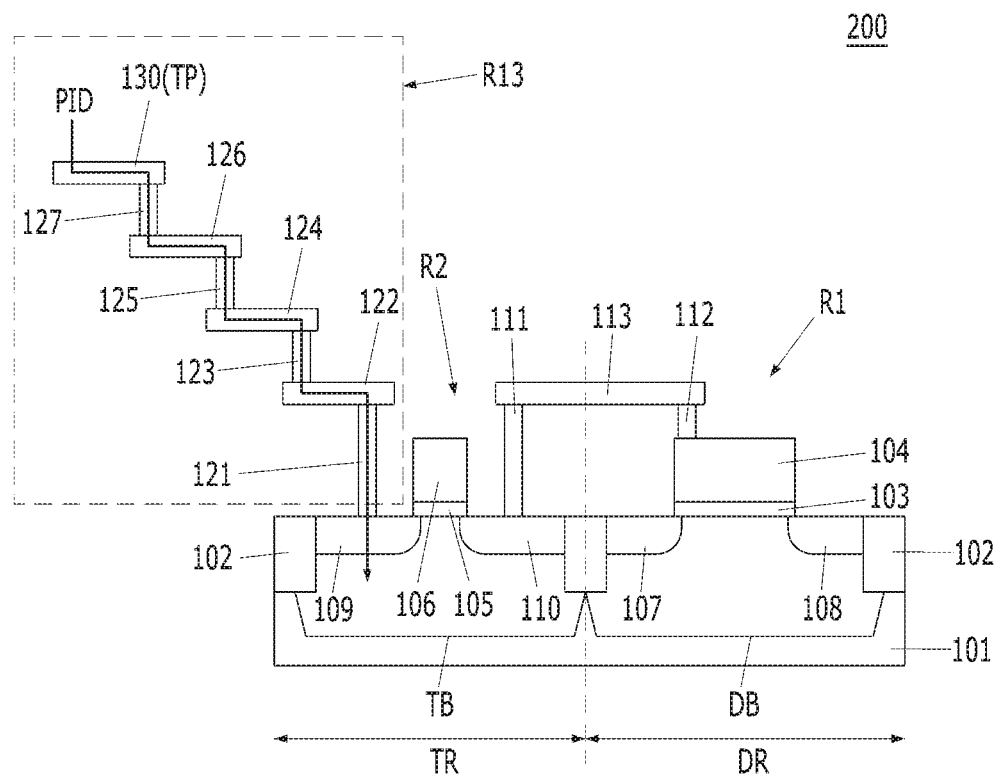
FIG. 3 is a cross-sectional view illustrating a semiconductor device in accordance with another embodiment of the present invention.

FIG. 3 is a cross-sectional view illustrating a semiconductor device 200 in accordance with another embodiment of the present invention. The equivalent circuit of the semiconductor device 200 of FIG. 3 may be the same as that of FIG. 1.

Referring to FIG. 3, the semiconductor device 200 may include a test transistor R1, a protection element R2, and a test pattern structure R13. The protection element R2 may be positioned at the front end of the test transistor R1. For example, the protection element R2 may be positioned between the test pattern structure R13 and the test transistor R1. The test transistor R1 may be a transistor, and for example a MOSFET. The protection element R2 may include a switching element. The protection element R2 may be a transistor and for example may be a MOSFET.

The semiconductor device 200 may include a substrate 101. The substrate 101 may include a semiconductor substrate. The substrate 101 may be any material suitable for semiconductor processing. The substrate 101 may be formed of a material containing silicon. The substrate 101 may include silicon, monocrystalline silicon, polysilicon, amorphous silicon, silicon germanium, monocrystalline silicon germanium, polycrystalline silicon germanium, carbon-doped silicon, a combination thereof or a multilayer thereof. The substrate 101 may include other semiconductor materials such as germanium. The substrate 101 may include a III/V-group semiconductor substrate, for example, a compound semiconductor substrate, such as GaAs. The substrate 101 may include an SOI (Silicon-On-Insulator) substrate.

The test transistor R1 and the protection element R2 may be isolated from each other by an isolation layer 102. The isolation layer 102 may be formed by a Shallow Trench Isolation (STI) process. The isolation layer 102 may include silicon oxide, silicon nitride, or a combination thereof. The isolation layer 102 between the test transistor R1 and the protection element R2 may prevent shorting of the 110 and 107 regions.

The test transistor R1 may be formed in a device region DR and the protection element R2 and the test pattern structure R13 may be formed in a test region TR. The test transistor R1 may include a first gate dielectric layer 103 and a first gate electrode 104. The first gate dielectric layer 103 may include silicon oxide, silicon nitride, silicon oxynitride or a high dielectric material. The first gate electrode 104 may include a silicon-containing material or a metal-containing material. The first gate electrode 104 may include polysilicon, tungsten, tungsten silicide, titanium nitride, tantalum nitride, or a combination thereof. The first gate electrode 104 may include an impurity-doped polysilicon, i.e., doped polysilicon. The impurity may include an N-type impurity or a P-type impurity. The impurity may include boron, arsenic, or a combination thereof. The test transistor R1 may further include a first source/drain region 107 and a second source/drain region 108. The first source/drain region 107 and the second source/drain region 108 may be doped with the same impurity. The first source/drain region 107 and the second source/drain region 108 may include an N-type impurity or a P-type impurity. The first source/drain region 107 and the second source/drain region 108 may be regions doped with a high-concentration impurity.

The protection element R2 may include a transistor, and for example a MOSFET. The protection element R2 may include a second gate dielectric layer 105 and a second gate electrode 106. The second gate dielectric layer 105 may include silicon oxide, silicon nitride, silicon oxynitride, or high-dielectric material. The second gate electrode 106 may include polysilicon, tungsten, tungsten silicide, titanium nitride, tantalum nitride, or a combination thereof. The second gate electrode 106 may include doped polysilicon. The impurity may include an N-type impurity or a P-type impurity. The impurities may include boron, arsenic, or a combination thereof. The protection element R2 may further include a first impurity region 109 and a second impurity region 110. The first impurity region 109 and the second impurity region 110 may be doped with the same impurity. The first impurity region 109 and the second impurity region 110 may include an N-type impurity or a P-type impurity. The first impurity region 109 and the second impurity region 110 may be referred to as a source region and a drain region, respectively. The first impurity region 109 and the second impurity region 110 may be regions doped with a high-concentration impurity. According to an embodiment of the present invention, the protection element R2 may include a transistor, for example an NMOSFET. Therefore, the first impurity region 109 and the second impurity region 110 may be referred to as an N-type source region and an N-type drain region, respectively.

The first gate dielectric layer 103 and the second gate dielectric layer 105 may be formed of the same material. The first gate dielectric layer 103 and the second gate dielectric layer 105 may be formed of different materials. The first gate electrode 104 and the second gate electrode 106 may be formed of the same material. The first gate electrode 104 and the second gate electrode 106 may be formed of different materials. The length of the second gate electrode 106 may be shorter than the length of the first gate electrode 106. In some embodiments of the present invention, the isolation layer 102 may partially overlap with both ends of the first gate dielectric layer 103.

The test transistor R1 and the protection element R2 may be electrically connected to each other through conductive contacts 111 and 112 and a conductive line 113. The second impurity region 110 of the protection element R2 and the first gate electrode 104 of the test transistor R1 may be coupled to each other. The second impurity region 110 and the first gate electrode 104 of the protection element R2 may be coupled to the conductive contacts 111 and 112, and the conductive contacts 111 and 112 may be coupled to one conductive line 113. The conductive contacts 111 and 112 may be formed of any suitable conductive materials, including, for example, polysilicon, metal, metal nitride, metal silicide, or a combination thereof. In an embodiment the conductive contacts 111 and 112 may include a silicon-containing conductive material. In another embodiment, the conductive contacts 111 and 112 may include a metal or a metal-containing conductive material. The conductive line 113 may include any suitable conductive material, including, for example, polysilicon, metal, metal nitride, metal silicide, or a combination thereof. In an embodiment, the conductive line 113 may include a metal, or a metal containing conductive material.

The test pattern structure R13 may include a plurality of via contacts 121, 123, 125 and 127 and a plurality of metal lines 122, 124, 126 and 130. The uppermost metal line among the metal lines may be referred to as a test pad TP 130. The first impurity region 109 of the protection element R2 may be electrically connected to the test pattern structure R13. A plurality of via contacts 121, 123, 125 and 127 and a plurality of metal lines 122, 124 and 126 may be positioned between the first impurity region 109 and the test pad 130. The via contacts 121, 123, 125 and 127 may include a silicon-containing material or a metal-containing material. The via contacts 121, 123, 125 and 127 may include polysilicon, metal, metal nitride, metal silicide, or a combination thereof. The metal lines 122, 124, and 126 may include tungsten, copper, or aluminum. The via contacts 121, 123, 125 and 127 and the metal lines 122, 124 and 126 may be formed by a damascene process. The damascene process may include a single damascene process, a dual damascene process, a via first process, a trench first process and the like. The via contacts 121, 123, 125 and 127 and the metal lines 122, 124 and 126 may be formed by deposition and etching processes, individually. The test pattern structure R13 may include a conductive path formed through via contacts 121, 123, 125 and 127 and the metal lines 122, 124 and 126.

The test pad 130 may include tungsten, copper, or aluminum.

The conductive line 113 and the lowermost metal line 122 may be positioned at the same level. The conductive line 113 and the lowermost metal line 122 may be formed by the same process.

As described above, since the lowermost metal line 122 is not directly coupled to the test transistor R1, a plasma-induced damage (PID) of the process after the via contact 123 cannot affect the test transistor R1.

When the lowermost metal line 122 is formed by a plasma etching process, plasma ions may be introduced into the lowermost metal line 122. According to an embodiment of the present invention, the lowermost metal line 122 may be coupled to the first impurity region 109 of the protection element R2. For this reason, the plasma ions may be discharged into the substrate 101 by passing through the first impurity region 109 of the protection element R2. As a result, a high potential is not applied to the first gate dielectric layer 103 of the test transistor R1, and therefore the first gate dielectric layer 103 is not damaged.

Just as in the plasma etching process for forming the metal lines 124 and 126 and the test pad 130 in the upper layer, the generated plasma charges may be discharged into the substrate 101 by passing through the first impurity region 109 of the protection element R2. Also, even though the plasma charges are collected in the lowermost metal line 122 when an inter-layer dielectric layer or another line layer is formed by using plasma after the lowermost metal line 122 is formed, the plasma charges may be discharged into the substrate 101 by passing through the first impurity region 109 of the protection element R2.

Referring to FIGS. 1 to 3, the protection element R2 may include a transistor, e.g., an NMOSFET.

A test operation for checking the characteristics of the test transistor R1 may be described as follows.

During the test operation, a normal gate voltage may be transferred to the test transistor R1. Thus, a voltage which is higher than the highest voltage to be applied to the first gate electrode 104 of the test transistor R1 by a threshold voltage may be applied to the second gate electrode 106 of the protection element R2. While the protection element R2 is turned on, the characteristics of the test transistor R1 may be checked by applying a voltage that is set to the first gate electrode 104 of the test transistor R1.

A voltage may be applied to the body of the protection element R2, that is, the protection element body TB of the substrate 101 where the protection element R2 is formed, during the test operation as described above. This may prevent malfunction of the test operation. When the protection element R2 includes an NMOSFET, a P-type well may be formed as the protection element body TB in the substrate 101. A voltage which is lower than the lowest voltage to be applied to the first gate electrode 104 of the test transistor R1 may be applied to the protection element body TB of the substrate 101.

Figure 4:
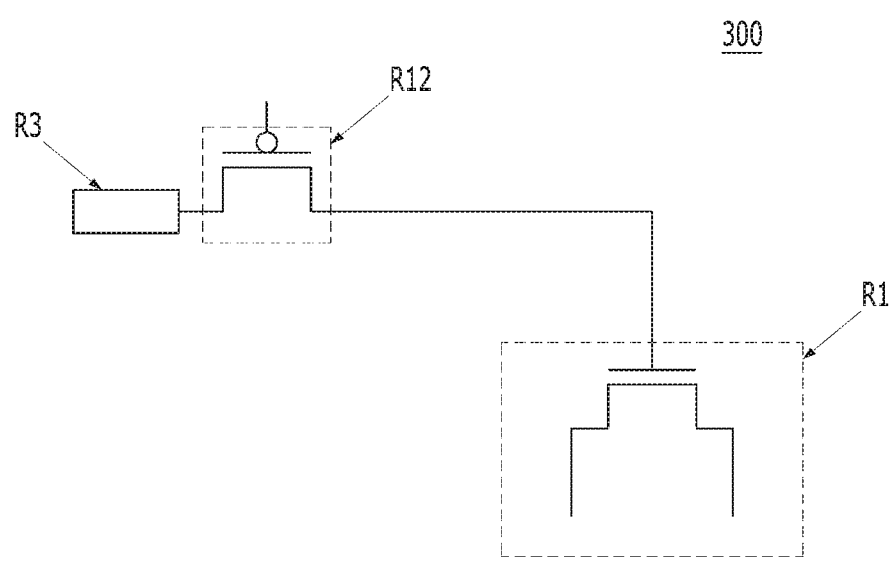
FIG. 4 is an equivalent circuit diagram of a semiconductor device in accordance with another embodiment of the present invention.

FIG. 4 is an equivalent circuit diagram of a semiconductor device 300 in accordance with another embodiment of the present invention.

Referring to FIG. 4, the semiconductor device 300 may include a test transistor R1, a test pattern structure R3, and a protection element R12 positioned between the test transistor R1 and the test pattern structure R3. The test transistor R1 and the test pattern structure R3 may be the same as the test pattern structure R3 of the semiconductor device 100 shown in FIG. 2. The test pattern structure R3 may be replaced with the test pattern structure R13 of the semiconductor device 200 shown in FIG. 3.

The protection element R12 may include a transistor, for example, a PMOSFET. A protection element body TB may be an N-type well.

A test operation for checking the characteristics of the test transistor R1 may be described as follows.

During the test operation, a normal gate voltage may be transferred to the test transistor R1. Therefore, a voltage which is lower than the lowest voltage to be applied to the gate of the test transistor R1 by a threshold voltage may be applied to the gate of the PMOSFET of the protection element R12. In this way, while the protection element R12 is turned on, the characteristics of the test transistor R1 may be checked by applying the voltage that is set to the gate of the test transistor R1.

A voltage may be applied to the body of the protection element R12, that is, the protection element body TB of the substrate 101 where the protection element R12 is formed, during the test operation as described above. This may prevent malfunction of the test operation. When the protection element R12 includes a PMOSFET, an N-type well may be formed as the protection element body TB in the substrate 101. A voltage which is higher than the highest voltage to be applied to the gate of the test transistor R1 may be applied to the protection element body TB of the substrate 101.

Figure 5:
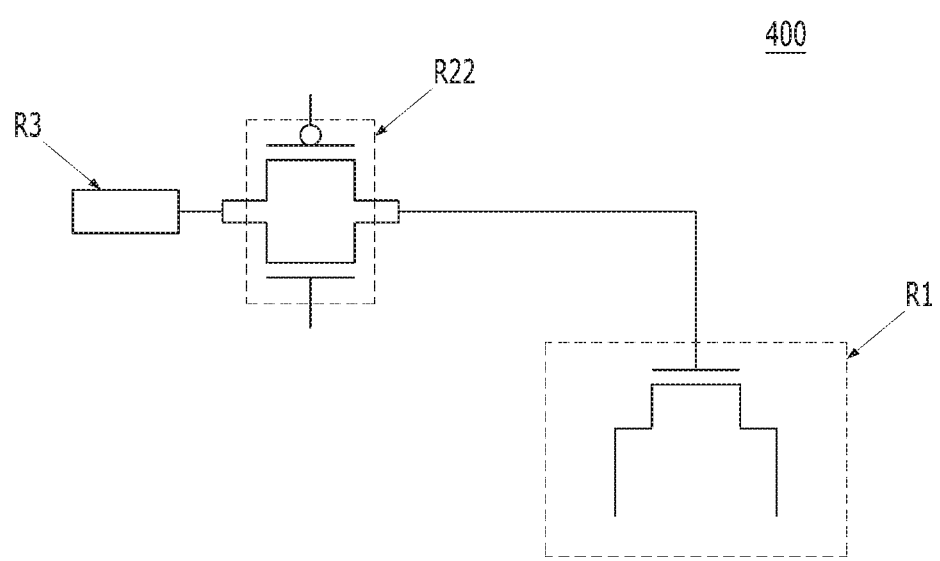
FIG. 5 is an equivalent circuit diagram of a semiconductor device in accordance with another embodiment of the present invention.

FIG. 5 is an equivalent circuit diagram of a semiconductor device 400 in accordance with another embodiment of the present invention.

Referring to FIG. 5, the semiconductor device 400 may include a test transistor R1, a test pattern structure R3, and a protection element R22 positioned between the test transistor R1 and the test pattern structure R3. The test transistor R1 and the test pattern structure R3 may be the same as the test pattern structure R3 of the semiconductor device 100 shown in FIG. 2. The test pattern structure R3 may be replaced with the test pattern structure R13 of the semiconductor device 200 shown in FIG. 3.

The protection element R22 may include a transmission gate. The transition mission gate may also be referred to as a transfer gate. The transmission gate may include an NMOSFET and a PMOSFET. The source/drain regions of the NMOSFET and the PMOSFET may be coupled to each other, and different voltages may be applied to a gate of the NMOSFET and a gate of the PMOSFET.

A test operation for checking the characteristics of the test transistor R1 may be described as follows.

During the test operation, a normal gate voltage may have to be transferred to the test transistor R1. Therefore, a voltage which is lower than the lowest voltage to be applied to the gate of the test transistor R1 may be applied to the gate of the PMOSFET of the protection element R22, and a voltage which is higher than the highest voltage to be applied to the test transistor R1 may be applied to the gate of the NMOSFET of the protection element R22. In this way, while the protection element R12 is turned on by applying the gate voltage to each of the PMOSFET and the NMOSFET, the characteristics of the test transistor R1 may be checked by applying the voltage that is set to the gate of the test transistor R1.

A voltage may be applied to the body of the protection element d to R22, that is, the protection element body TB of the substrate 101 where the protection element R22 is formed, during the test operation as described above. This may prevent malfunction of the test operation. When the protection element R22 includes a transmission gate, a PMOSFET body (N-type well) where a PMOSFET is formed and an NMOSFET body (P-type well) where an NMOSFET is formed may be formed in the protection element body TB of the substrate 101. A voltage which is lower than the lowest voltage to be applied to the gate of the test transistor R1 may be applied to the NMOSFET body of the substrate 101. A voltage which is higher than the highest voltage to be applied to the gate of the test transistor R1 may be applied to the PMOSFET body of the substrate 101. Any voltages may be applied to the source, drain, and body of the test transistor R1.

TABLE 1

| Terminal | PAD | Test Voltage |
| --- | --- | --- |
| Gate of test transistor | PAD A | 0~3 V |
| PMOSFET gate of protection element | PAD B | 0 V or lower |
| PMOSFET body of protection element | PAD C | 3 V or higher |
| NMOSFET gate of protection element | PAD D | 3 V or higher |
| NMOSFET body of protection element | PAD E | 0 V or lower |

In Table 1, PAD A to PAD E may refer to pads for applying a voltage to each terminal. In order to reduce the number of pads used, PAD B and PAD E may be formed of one pad. Also, PAD C and PAD D may be formed of one pad. The NMOSFET body and the PMOSFET body may correspond to a protection element body TB.

Referring to Table 1, a voltage selected in a range of approximately 0V to 3V may be transferred to the gate of the test transistor R1 through the test pattern structure R3. For example, a test voltage selected in the range of approximately 0V to 3V may be applied to a test pad (see '130' in FIG. 2) of the test pattern structure R3, and the test voltage may be transferred to the gate of the test transistor R1. A voltage of approximately 0V or lower may be applied to the gate of the PMOSFET and the body of the NMOSFET of the protection element R22, and a voltage of approximately 3V or higher may be applied to the body of the PMOSFET body and the gate of NMOSFET of the protection element R22.

The test voltage as shown in Table 1 may be similarly applied in the semiconductor device shown in FIG. 1 and FIG. 4.

In the test operation of the semiconductor device 100 of FIG. 1, a test voltage selected in the range of approximately 0 V to 3 V may be applied to the test pattern structure R3, and the test voltage may be transferred to the gate of the test transistor R1. Since the protection element R2 includes the NMOSFET, a voltage which is lower than the lowest voltage of the test voltage may be applied to the protection element body TB, and a voltage which is higher than the highest voltage of the test voltage by a threshold voltage may be applied to the gate of the NMOSFET of the protection element R2. The protection element body TB may be referred to as an NMOSFET body.

In the test operation of the semiconductor device 300 of FIG. 4, a test voltage selected in the range of approximately 0V to 3V may be applied to the test pattern structure R3, and the test voltage may be transferred to the gate of the test transistor R1. Since the protection element R12 includes the PMOSFET, a voltage which is lower than the lowest voltage of the test voltage by a threshold voltage may be applied to the gate of the PMOSFET of the protection element R12, and a voltage which is higher than the highest voltage of the test voltage may be applied to the protection element body TB of the protection element R12. The protection element body TB may be referred to as a PMOSFET body.

FIGS. 6A to 6D are cross-sectional views illustrating a method for fabricating a semiconductor device in accordance with an embodiment of the present invention. FIGS. 6A to 6D may illustrate an example of a method for fabricating the semiconductor device 200 of FIG. 3.

Figure 6A:
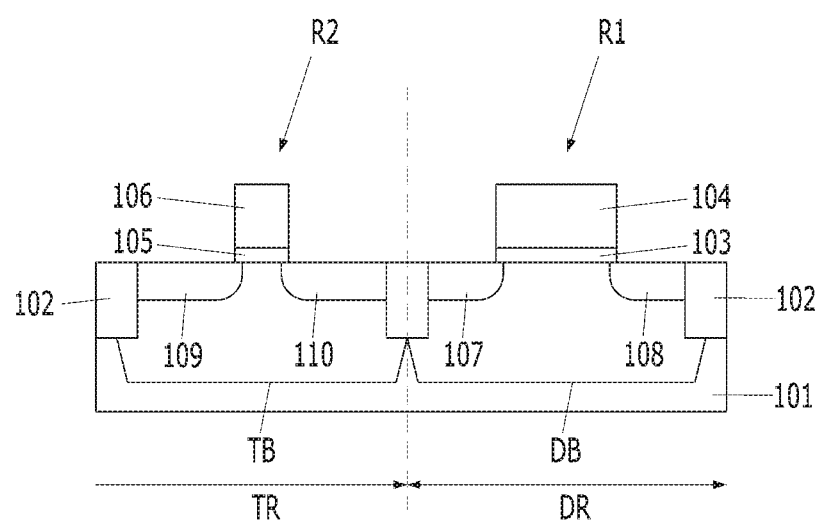
FIGS. 6A to 6D are cross-sectional views illustrating a method for fabricating a semiconductor device in accordance with an embodiment of the present invention.

Referring to FIG. 6A, a test transistor R1 and a protection element R2 may be formed. The test transistor R1 and the protection element R2 may be formed simultaneously. First, an isolation layer 102 may be formed in the substrate 101. The isolation layer 102 may be formed by a Shallow Trench Isolation (STI) process. For example, after forming a trench in the substrate 101, the trench may be filled with a dielectric material. The isolation layer 102 may include silicon oxide, silicon nitride, or a combination thereof.

The substrate 101 may include a device region DR and a test region TR. The test transistor R1 may be formed in the device region DR, and the protection element R2 may be formed in the test region TR. A test transistor body DB for the test transistor R1 may be formed in the device region DR of the substrate 101. A protection element body TB for the protection element R2 may be formed in the test region TR of the substrate 101. The protection element body TB may have a different structure depending on the transistor that is applied as the protection element R2. When the protection element R2 is an NMOSFET, the protection element body TB may be a P-type well. When the protection element R2 is a PMOSFET, the protection element body TB may be an N-type well. When the protection element R2 is a transmission gate, the protection element body TB may include both of the N-type well and the P-type well. The test transistor body DB may be the same as the protection element body TB.

The test transistor R1 may include a first gate dielectric layer 103, a first gate electrode 104 over the first gate dielectric layer 103, a first source/drain region 107 and a second source/drain region 108. The protection element R2 may include a second gate dielectric layer 105, a second gate electrode 106, a first impurity region 109, and a second impurity region 110.

The first gate dielectric layer 103 and the second gate dielectric layer 105 may be formed of the same material. The first gate electrode 104 and the second gate electrode 106 may be formed of the same material.

In order to form the first source/drain region 107 and the second source/drain region 108, a doping process of doping an impurity may be performed. The first source/drain region 107 and the second source/drain region 108 may include an N-type impurity or a P-type impurity.

The impurity doping process may be performed to form the first impurity region 109 and the second impurity region 110 of the protection element R2. The first impurity region 109 and the second impurity region 110 may include an N-type impurity or a P-type impurity.

The first and second source/drain regions 107 and 108 of the test transistor R1 and the first and second impurity regions 109 and 110 of the protection element R2 may be formed of the same impurity. In an embodiment, the first and second source/drain regions 107 and 108 of the test transistor R1 and the first and second impurity regions 109 and 110 of the protection element R2 may be formed of the same impurity at the same time.

Figure 6B:
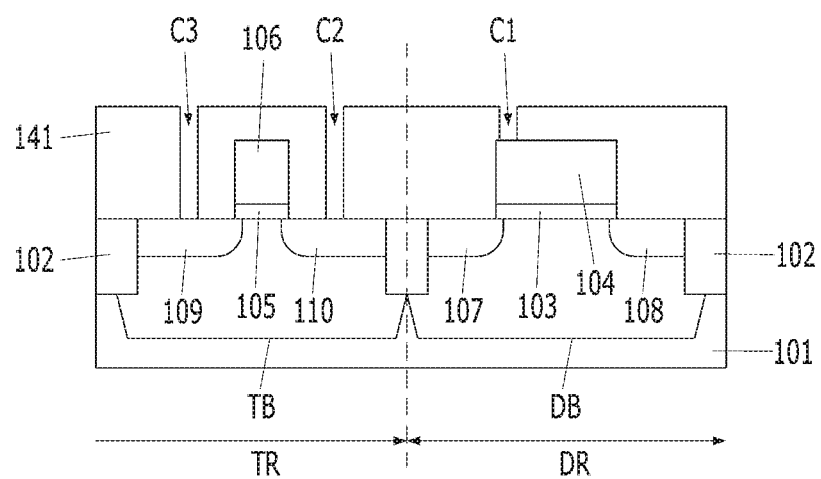

Referring to FIG. 6B, an inter-layer dielectric layer 141 may be formed over the entire profile of the substrate 101. In an embodiment, the inter-layer dielectric layer 141 may include silicon oxide.

A plurality of contact holes C1, C2 and C3 may be formed by etching the inter-layer dielectric layer 141. The contact holes C1, C2 and C3 may include a first contact hole C1, a second contact hole C2, and a third contact hole C3. The first contact hole C1 may expose the first gate electrode 104 of the test transistor R1. The second contact hole C2 and the third contact hole C3 may expose the first and second impurity regions 109 and 110 of the protection element R2, respectively. The first contact hole C1 may be shallower than the second and third contact holes C2 and C3 in terms of depth.

Figure 6C:
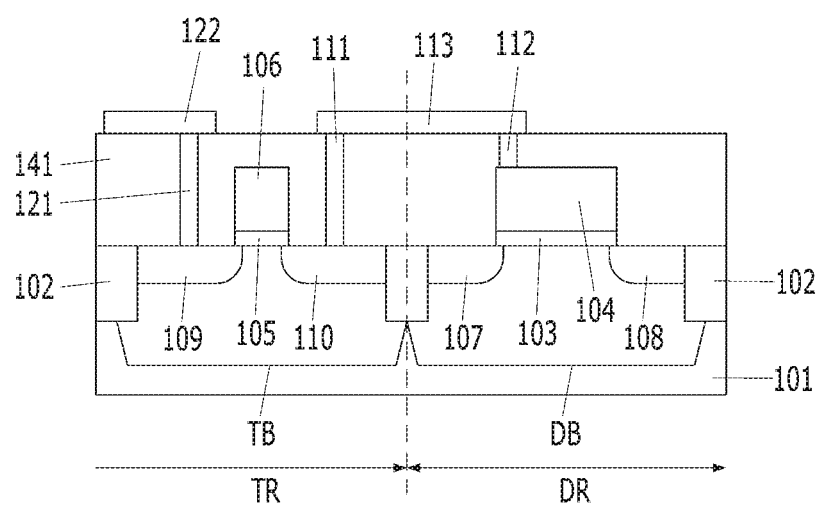

Referring to FIG. 6C, the first contact hole C1 and the second contact hole C2 may be filled with a suitable conductive material to form the conductive contacts 111 and 112. The third contact hole C3 may be filled with a suitable conductive material to form the via contact 121. For example, the conductive contacts 111 and 112 and the via contact 121 may be formed to include polysilicon, metal, metal containing material and the like. In an embodiment, the first, second and third contact holes C1, C2 and C3 may be filled simultaneously with the same conductive material.

A conductive line 113 may then be formed over the interlayer dielectric layer to contact the conductive contacts 111 and 112. The conductive line 113 may, for example, include a metal or metal containing material. When the conductive line 113 is formed, a metal line 122 coupled to the via contact 121 may be formed. The conductive line 113 and the metal line 122 may be formed by depositing a metal layer and performing a plasma etching process. In an embodiment, the conductive line 113 and the metal line 122 may be formed simultaneously.

Figure 6D:
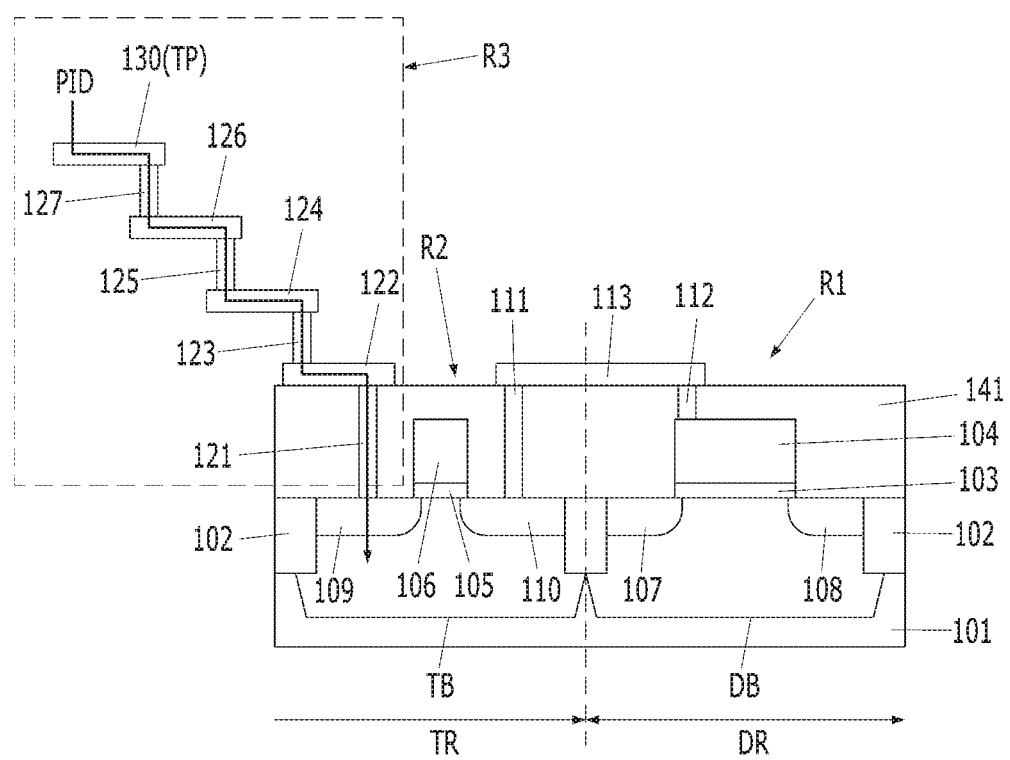

Referring to FIG. 6D, a plurality of via contacts 123, 125 and 127 and a plurality of metal lines 124, 126, and 130 may be formed. The via contacts 123, 125 and 127 and the metal lines 124, 126, and 130 may be formed in the test region TR. The via contacts 123, 125 and 127 and the metal lines 124, 126, and 130 may be formed by a forming method which is similar to the method of forming the via contact 121 and the metal line 122. The via contacts 123, 125 and 127 and the metal lines 124, 126, and 130 may form a test pattern structure R13. The uppermost metal line 130 may become a test pad TP 130.

According to an embodiment of the present invention, it is possible to prevent a test transistor from a plasma-induced damage by forming a protection transistor between the test transistor and a test pattern structure.

Also, according to an embodiment of the present invention, the test structure of a semiconductor device may more accurately measure the device characteristics, as the plasma-induced damage of a transistor occurring due to an etching process using plasma is discharged through a protection transistor.

While the present invention has been described with respect to specific embodiments, it will be apparent to those skilled in the art that various changes and modifications may be made without departing from the spirit and scope of the invention as defined in the following claims.

What is claimed is:

1. A semiconductor device, comprising:
   a test transistor over a substrate;
   a test pattern structure; and
   a protection transistor which is operatively positioned between the test pattern structure and the test transistor for protecting the test element from a plasma induced damage,
   wherein the test pattern structure is coupled to the protection transistor and is not directly coupled to the test transistor, and wherein plasma charges induced from the test pattern structure are discharged into the substrate by passing through the protection transistor,
wherein the protection transistor comprises:
a gate electrode formed over the substrate;
a gate dielectric layer formed between the substrate and the gate electrode; and
a first impurity region and a second impurity region that are formed in the substrate on both sides of the gate electrode,
wherein the test pattern structure is directly coupled to the first impurity region of the protection transistor,
wherein the second impurity region of the protection transistor is coupled to a gate electrode of the test transistor, and
wherein the test pattern structure does not connect directly to the gate electrode of the protection transistor.

2. The semiconductor device of claim 1, wherein the test pattern structure is formed to be spaced apart from the test transistor.

3. The semiconductor device of claim 1,
wherein the gate electrode of the protection transistor is shorter than a gate electrode of the test transistor.

4. The semiconductor device of claim 1, wherein the first impurity region of the protection transistor discharges a plasma-induced damage caused in the test pattern structure to the substrate.

5. The semiconductor device of claim 3, further comprising:
conductive contacts that are respectively coupled to the second impurity region and the gate electrode of the test transistor; and
a conductive line suitable for coupling the conductive contacts to each other.

6. The semiconductor device of claim 1, wherein the test pattern structure includes at least one via contact and at least one metal line.

7. The semiconductor device of claim 1, wherein the protection transistor includes an NMOSFET.

8. The semiconductor device of claim 1, wherein the protection transistor includes a PMOSFET.

9. The semiconductor device of claim 1, wherein the protection transistor includes a transmission gate provided with an NMOSFET and a PMOSFET.

10. The semiconductor device of claim 3, wherein the substrate includes a device region where the test transistor is formed and a test region where the protection transistor is formed.

11. The semiconductor device of claim 10, further comprising an isolation layer which is formed in the substrate and isolates the device region and the test region from each other.

12. The semiconductor device of claim 11, wherein the device region includes a test transistor body which is formed in the substrate, and the test region includes a protection transistor body which is formed in the substrate, and each of the test transistor body and the protection transistor body includes a conductive well.

13. The semiconductor device of claim 3,
wherein the test pattern includes a via contact extending perpendicularly through an interlayer insulating layer to contact the first impurity region of the protection transistor, and
wherein the test pattern includes a metal line formed over the interlayer insulating layer and is in contact with the via contact.

14. The semiconductor device of claim 3, wherein the test pattern structure includes a conductive path formed via a plurality of via contacts and a plurality of metal lines.

* * * * *